Nov. 9, 1971 MASAO MATSUO ET AL 3,618,200
METHOD OF MANUFACTURING CHIP-SHAPED PASSIVE
ELECTRONIC COMPONENTS
Filed April 17, 1970 2 Sheets-Sheet 1

INVENTORS
MASAO MATSUO
HIROSHI TOMIWA
BY
[signature]
ATTORNEY

INVENTORS
MASAO MATSUO
HIROSHI TOMIWA

BY

ATTORNEY

United States Patent Office 3,618,200
Patented Nov. 9, 1971

3,618,200
METHOD OF MANUFACTURING CHIP-SHAPED PASSIVE ELECTRONIC COMPONENTS

Masao Matsuo, Takarazuka, and Hiroshi Tomiwa, Osaka, Japan, assignors to Matsuo Electric Company, Limited, Osaka-fu, Japan Filed Apr. 17, 1970, Ser. No. 29,413
Int. Cl. B01j *17/00*
U.S. Cl. 29—570 5 Claims

ABSTRACT OF THE DISCLOSURE

An improved method of manufacturing an electronic component wherein a plurality of elements are formed on the ends of a plurality of elongated conductive members. The elements and conductive members are then electrically connected to terminals carried by a frame, and the resultant structure is then enclosed by a resin after an adhesive sheet has been placed on one side of the frame to protect the terminals. Thereafter the adhesive sheet is removed to expose the terminals and the individual completed components are removed from the frame.

This invention relates to a method of manufacturing chip-shaped passive electronic components such as capacitors and the like and more particularly to a novel and improved method for manufacturing passive electronic components wherein the completed component is embedded in a resin.

Electronic components in the present state of the electronic art must be as small as possible and many prior art components are provided with external leads which involve a number of additional manual operations to facilitate attachment to a hybrid printed circuit board. The use of such known components has created difficulties in the manufacture of printed circuits.

Chip-shaped passive electronic components which are provided with flat terminals in place of leads to facilitate bonding to a printed circuit board have been proposed. However, because of their relatively small size, difficulties have been encountered in the provision of jigs, and the development of methods for holding the terimnals and connecting them to the electrodes of the components. Accordingly, mass production was very difficult and a considerable portion of the cost of the component was incurred in the manufacture thereof.

One object of the invention resides in the provision of a novel and improved method for manufacturing a number of passive electric components, each having at least two terminals arranged on one face of the component. This is attained by either successively or concurrently assembling a plurality of elements or parts thereof and then simultaneously embedding them in a resin thereby enabling the components to be manufactured at a materially reduced cost.

According to the invention a plurality of electronic components embedded in a resin are formed by supporting a plurality of terminals on a single supporting frame, attaching the electronic components to the terminals, embedding the assemblies in a synthetic resin and thereafter separating the individual components. More specifically, after the components have been attached to the terminals carried by the frame, an adhesive sheet is adhered to one face of the terminal frame and the resin is then applied to the other face of the frame to enclose the components. Removal of the adhesive sheet then exposes the terminals which serve to connect the components to associated circuits.

In carrying out the method in accordance with the invention, a sheet of metal is stamped or etched to form a terminal supporting frame for supporting a plurality of terminals. The electronic elements are then secured to the ends of a plurality of elongated conductive members extending outwardly from a comb-like supporting strip. One surface of each electronic element is then bonded to a terminal of said frame as for example by soldering or welding.

The adhesive sheet is then applied to the back face of the terminal supporting frame and the unused portions of the elongated conducting members are removed. Thereafter the electronic elements are embedded in a resin by using a suitable molding process such as injection molding or the like. The adhesive supporting sheet is then removed, and the individual components are separated by a suitable cutting process. Electrical testing and inspection may be accomplished either before or after the components are separated.

The above and other objects of the invention will become more apparent from the following description and accompanying drawings forming part of this application.

Figure 1:
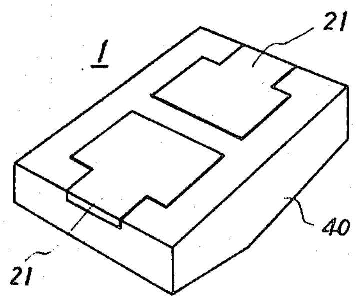
FIG. 1 is a perspective view of a tantalum solid state electrolytic capacitor manufactured in accordance with the invention.
Figure 2:
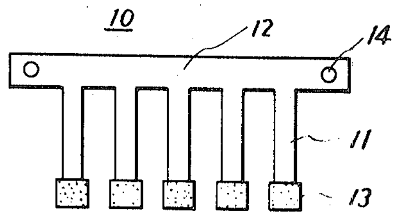
FIG. 2 is a plan view of a comb-like structure used in the formation of components in accordance with the invention.

Referring to FIG. 1, the numeral 1 denotes a tantalum solid state electrolytic capacitor manufactured in accordance with the invention. The capacitor includes a pair of terminals 21 which are exposed on the back side and the capacitor is embedded in a resin housing 40. The method of manufacturing the capacitor is illustrated in FIGS. 2 through 7. In FIG. 2 a comb-like structure of conductive material is denoted by the numeral 10 and includes a plurality of elongated conductive members 11 attached in spaced relationship to a common supporting member or bridge 12. The comb-like structure may be formed from a single sheet of metal such as tantalum, titanium, niobium, or aluminum by any suitable process such as stamping or the like. While the number of elongated conductive members 11 would normally be of the order of thirty or even more, only five have been illustrated in this figure. Capacitor elements 13 are secured to the ends of the elongated conductive members 11. The elements 13 may be formed for example by welding an anode body consisting of sintered tantalum powder to each of the elongated conductive members 11 and then subsequently forming an anodic oxide layer, a manganese layer and a cathode layer comprising carbon and silver in accordance with conventional techniques of fabricating tantalum solid state electrolytic capacitors. While the anode body is described as being formed of tantalum powder, it may of course be formed of powders of other film-forming metals such as aluminum, titanium or niobium or may also be prepared by suitably processing a wire or plate of such material. Holes 14 are provided in the bridge portion 12 for aligning purposes as will be described.

Figure 3:
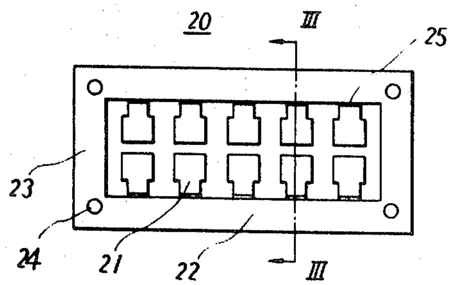
FIG. 3 is a plan view of a terminal frame used in accordance with the invention.
Figure 3A:
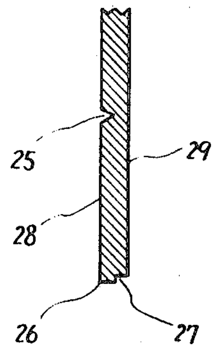
FIG. 3A is a fragmentary cross-sectional view taken along the line III—III of FIG. 3.

FIGS. 3 and 3A illustrate a terminal frame generally denoted by the numeral 20 and which includes a plurality of terminals 21 supported by two elongated frame portions 22, the latter being connected one to the other by end connecting members 23. The number of pairs of terminals 21 on the frame 20 should preferably be equal to the number of elongated conductive members 11 on the structure 10 illustrated in FIG. 2. The frame 20 may be of unitary construction and formed from a single sheet of weldable or solderable material such as nickel, Kovar, iron, or copper, and the terminals may be formed by stamping, chemical etching or the like.

A notch or groove 25 is preferably formed between each terminal 21 and the associated bridge portion 22 to facilitate removal of the bridge portions after embedding the capacitor elements in a resin. FIG. 3A is an enlarged view of one of the terminals of FIG. 3 and illustrates the groove 25. The outer end of the terminal is preferably provided with a stepped portion 27 so that the inner surface 28 extends to a point 26 beyond the back surface 29. The stepped portion may be formed by the utilization of appropriate masks applied to both surfaces of the metal sheet when forming the terminal frame 20. As will become apparent, the step 27 serves to lock the end of the terminal in the resin 40 and thus produces a more rugged structure. If desired, the ends of the terminals 21 can have concave or convex end faces or the end face can merely be inclined in order to achieve the same end. The frame 20 is also provided with holes 24 to facilitate alignment with the structure as shown in FIG. 2.

The terminals 21 of the terminal frame 20 are preferably plated with gold, silver, or solder in order to facilitate attachment of the capacitor elements 13 thereto. If desired, the metal sheet used to form the terminal frame may be plated prior to its formation by stamping or other suitable means.

Figure 4:
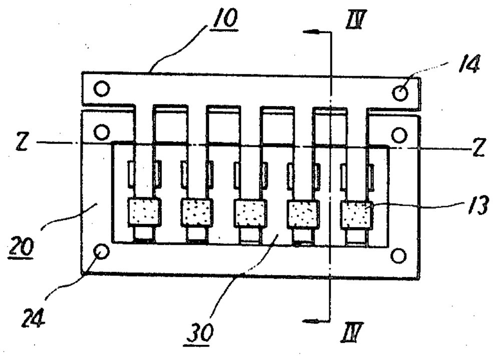
FIG. 4 is a plan view of the frame shown in FIG. 3 with the comb-like structure of FIG. 2 placed in overlying relationship thereto.
Figure 4A:
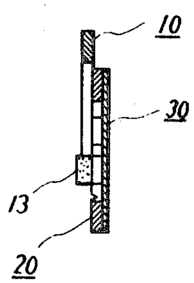
FIG. 4A is a cross-sectional view taken along the line IV—IV of FIG. 4.

A paste solder or conductive paint is then applied to the capacitor elements 13 and the comb-like assembly 10 is then placed on the frame 20 so that the capacitor elements 13 are in precise alignment with corresponding terminals 21 on one side of the frame 20. The elongated conductive members 11 are also aligned with the terminals 21 on the other side of the frame 20 as illustrated in FIGS. 4 and 4A. This process is carried out through the use of a suitable jig (not shown) having posts for engaging the openings 14 and 24 to automatically align the assembly 10 with the frame 20. If the terminals 21 have previously been coated with solder, the utilization of the paste solder or conductive paint on the capacitor elements can be omitted. After the elongated conductive members 11 are welded to one set of terminals 21, the assembly is then heated by suitable means to bond the capacitor elements 13 to the corresponding terminals 21. If desired, the bonding may be accomplished by the use of an electroconductive adhesive agent containing silver as the host material. The assembly may then be washed and cleaned if necessary to remove the flux.

The next step involves the application of an adhesive sheet 30 to the back face of the frame 20. This adhesive sheet may be in the form of an adhesive tape, an adhesive coated plate or an adhesive tape having a metal backing plate. If desired, the adhesive sheet may be applied before the assembly 10 is placed in overlying relationship with the frame 20 in which case an electroconductive adhesive agent would be used for bonding.

The adhesive agent used on the adhesive sheet 30 should preferably be a water soluble adhesive. In so doing, removal of the adhesive sheet may be more readily effected by immersing the structure in water and thereby avoiding the need for mechanical procedures which frequently leave part of the adhesive agent on the terminal faces.

Figure 5:
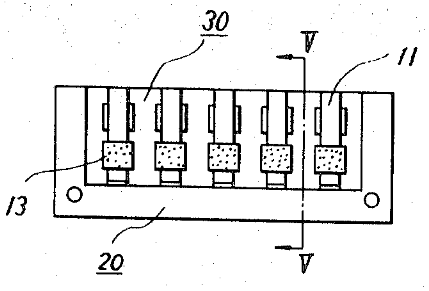
FIG. 5 is a plan view of the assembly shown in FIG. 4 and illustrating the next step in the manufacture of components.
Figure 5A:
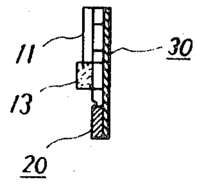
FIG. 5A is a cross-sectional view taken along the line V—V of FIG. 5.
Figure 6:
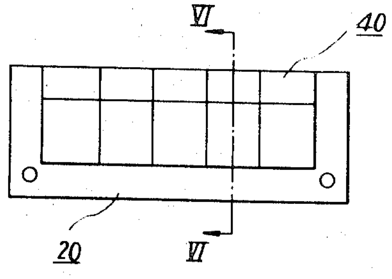
FIG. 6 is a plan view similar to FIG. 5 after embedding the components in a resin.
Figure 6A:
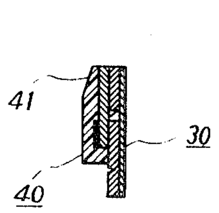
FIG. 6A is a cross-sectional view of FIG. 6 taken along the line VI—VI thereof.

After the application of the adhesive sheet 30, the assembly as illustrated in FIG. 4 is cut along the line Z—Z to remove the bridging portion 12 of the structure 10 and also one side 22 of the frame 20. The resultant assembly is shown in FIGS. 5 and 5A, and the terminals 21 are held in place by the adhesive sheet 30. The assembly as illustrated in FIG. 5 is then placed in a suitable metal mold which is then filled with a synthetic resin to completely enclose the capacitor elements 13 to provide a complete enclosure 40 as shown in FIGS. 6 and 6A. The synthetic resin may be any suitable resin well-known in the art and conventional injection molding procedures may be used as in the case of other electronic components. During the molding process an inclined surface 41 may be provided on the resin enclosure 40 to indicate polarity though it is apparent that other means may be utilized for this purpose. Upon completion of the molding process the adhesive sheet 30 is removed. Since the adhesive sheet was applied to the back face of the frame 20, the resin was prevented from flowing between the adhesive sheet and the back faces of the terminals 20. Accordingly, the back surfaces of the terminals 21 will be exposed and may be coated with solder, if desired, to facilitate connection to a printed circuit.

Figure 7:
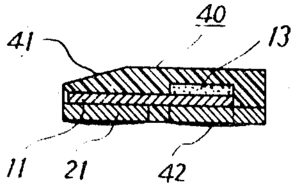
FIG. 7 is a cross-sectional view of a completed tantalum solid state electrolytic capacitor manufactured in accordance with the invention.

The individual capacitors are then electrically tested, inspected and aged, and thereafter the remainder of the frame 20 is removed by merely breaking the remaining side 22 of the frame from the terminals 21 along the line of notches 25. The resultant molded body is then cut to separate the individual capacitors as illustrated in FIG. 7. In FIG. 7 the numeral 42 denotes the solder coatings applied to the back faces of the terminals.

Figure 8:
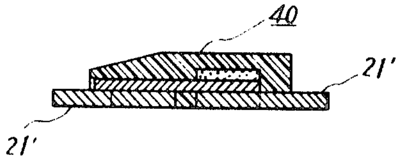
FIG. 8 is a cross-sectional view of a modified form of a tantalum solid state electrolytic capacitor manufactured in accordance with the invention.

Should it be desired to provide elongated terminals 21′ as shown in FIG. 8 to facilitate attachment of the capacitor to a printed circuit board, they can be formed by appropriately selecting the shape of the terminals formed on the frame 20.

Figure 9:
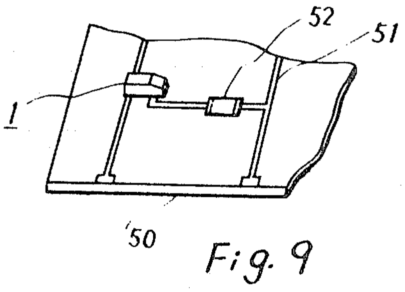
FIG. 9 is a perspective view of a fragmentary portion of a hybrid printed circuit board with a tantalum solid state electrolytic capacitor manufactured in accordance with the invention attached thereto.

FIG. 9 illustrates a printed circuit board 50, printed conductors 51, a printed resistor 52, and a capacitor 1 formed in accordance with the invention electrically connected to the printed conductors.

With the invention as described above, the assembling and molding processes to form a chip-shaped passive electronic component greatly facilitates the manufacturing operation since a large number of components can be formed at the same time. Furthermore, electronic components made in accordance with the invention effect a material saving in mechanical operations since a number of components can be bonded to a printed circuit board simultaneously through the utilization of face bonding techniques wherein supersonic oscillation or heat is utilized to bond the terminals 42 to the printed conductors.

While this invention has been described in connection with the manufacture of a tantalum solid state electrolytic capacitor, it is of course applicable to other types of electronic components such as inductors and the like. Furthermore, the invention is equally applicable to more complicated electronic components having three or more terminals by providing an appropriate arrangement of terminals on the terminal frame.

While only certain embodiments of the invention have been illustrated and described, it is apparent that alterations, modifications and changes may be made without departing from the true scope and spirit thereof as defined by the appended claims.

We claim:

1. A method for manufacturing chip-shaped electronic components comprising the steps of forming a plurality of sets of terminals with said terminals fixed in selected spaced relationship by a supporting frame, affixing an adhesive sheet to one side of said terminals and frame, connecting electronic elements to the other side of said sets of terminals, one element being connected to each of said sets, embedding said other side of said terminals and said elements in a resin, removing said frame and adhesive sheet and then separating the individual components one from the others.

2. A method of manufacturing chip-shaped electronic components according to claim 1 wherein grooves are formed along the boundaries between said terminals and said terminal supporting frame.

3. A method of manufacturing chip-shaped electronic components, according to claim 1, wherein at least an edge of each of said terminals is shaped to have a contour other than a plane perpendicular to said principal surfaces, whereby said edge at least partially underlies said resin.

4. A method of manufacturing chip-shaped electronic components, according to claim 1, wherein said adhesive sheet is formed with a metal backing plate.

5. A method of manufacturing chip-shaped electronic components according to claim 1 wherein said adhesive is water-soluble.

References Cited

UNITED STATES PATENTS

| | | | |
|---|---|---|---|
| 3,423,516 | 1/1969 | Segerson | 29—628 X |
| 3,423,516 | 1/1969 | Segerson | 29—628 X |
| 3,444,441 | 5/1969 | Helda et al. | 29—598 X |
| 3,550,228 | 12/1970 | Asscher | 29—590 |

JOHN F. CAMPBELL, Primary Examiner

C. E. HALL, Assistant Examiner

U.S. Cl. X.R.

29—588, 590, 628, 630 B; 264—272